United States Patent [19]

Kim

[11] Patent Number: 5,742,397

[45] Date of Patent: Apr. 21, 1998

[54] CONTROL DEVICE OF THE POSITION AND SLOPE OF A TARGET

[75] Inventor: Sang-Cheol Kim, Kyounggi-do, Rep. of Korea

[73] Assignee: Samsung Aerospace Industries, Ltd., Kyeongsangnam-do, Rep. of Korea

[21] Appl. No.: 517,581

[22] Filed: Aug. 21, 1995

[30]     Foreign Application Priority Data

Aug. 24, 1994  [KR]   Rep. of Korea ............... 94-20931

[51] Int. Cl.$^6$ ................. G01B 11/00; G01N 21/86
[52] U.S. Cl. ............................ 356/399; 250/548
[58] Field of Search ................. 356/399–401,
356/371, 375, 1, 152; 250/548, 561, 557,
231; 355/53; 372/99, 108; 331/94.5

[56]           References Cited

U.S. PATENT DOCUMENTS

| | | | |
|---|---|---|---|
| 3,588,738 | 6/1971 | Goodwin | 331/94.5 |
| 3,609,588 | 9/1971 | McKnight | 331/94.5 |
| 3,747,019 | 7/1973 | Koechner | 331/94.5 |
| 4,114,180 | 9/1978 | Kayanuma | 358/128 |
| 4,902,900 | 2/1990 | Kamiya | 250/548 |
| 4,999,669 | 3/1991 | Sakamoto | 355/53 |
| 5,114,236 | 5/1992 | Matsugu | 356/401 |
| 5,216,235 | 6/1993 | Lin | 250/201.6 |
| 5,414,515 | 5/1995 | Kawashima | 356/371 |
| 5,461,237 | 10/1995 | Wakamoto | 250/548 |

Primary Examiner—Frank G. Font
Assistant Examiner—Michael P. Stafira
Attorney, Agent, or Firm—Finnegan, Henderson, Farabow, Garrett & Dunner, L.L.P.

[57]           ABSTRACT

The present invention relates generally to a control device for controlling the position and slope of a target, and more particularly, to a control device to keep the position and slope of a target, such as a wafer or a substrate, within limits of a focus-depth of a projection lens.

The control device comprises a light source that emits light to be transmitted to and reflected from the target; a first mask through which the light emitted from the light source passes, and on which an asymmetric pattern is recorded; first and second photoreceivers for detecting the light reflected from the target; and control device for adjusting the position and slope of the target based on signals received from the photoreceiver.

22 Claims, 6 Drawing Sheets

CONTROL DEVICE OF THE POSITION AND SLOPE OF A TARGET

BACKGROUND OF THE INVENTION

1. Field of Invention

The present invention relates generally to a control device of the position and slope of a target, and more particularly, to a control device to maintain the position and slope of a target, such as a wafer or a substrate, which is detected by light-exposure equipment used for production of semiconductors and liquid crystal displays (LCDs), within the range of the focus-depth of a projection lens.

2. Description of Related Art

Generally, exposure equipment used in the production process of semiconductor devices includes a projection lens and a substrate support. A mask on which a pattern is already formed is located at the upper part of a projection lens, and then, the upper part of the mask is exposed to light. The light, shines through the mask, passes through the projection lens and reaches the semiconductor substrate which is placed on the substrate support. The substrate must be placed exactly in the focal plane of the projection lens and be horizontal. If the target is slightly out of focus or slightly sloped, an inferior semiconductor device is produced because the light is not exposed properly to the substrate because the pattern which is carved on the mask is very microscopic. Inaccuracies may occur because of substrate warp or stagger due to patterns having already formed on the substrate or because of distortion of the projection lens.

Therefore, for exposure equipment of this type, it is important to place the substrate horizontal and exactly in at the focal plane by adjusting its position and slope precisely.

The basic principles of operating control devices to control the position and angle (slope) of a target by an optical method, known up to date, are practically identical. The light, which is reflected from any object acting as a substrate, goes through a fixed path. If the object changes its position from the standard position, the reflected light after the object shifts position goes through a different path then before it shifted its position. By detecting changes in the path of this reflected light, the shifted position of the object can be detected.

Conventionally, photoreceivers of several types are used to detect the path change of reflected light as above. For example, the path change of reflected light is detected by cutting off the light partially or wholly according to the path change after forming a pin hole in front of the photoreceiver, or detected directly by using a position sensitive detector (PSD).

Figure 1:
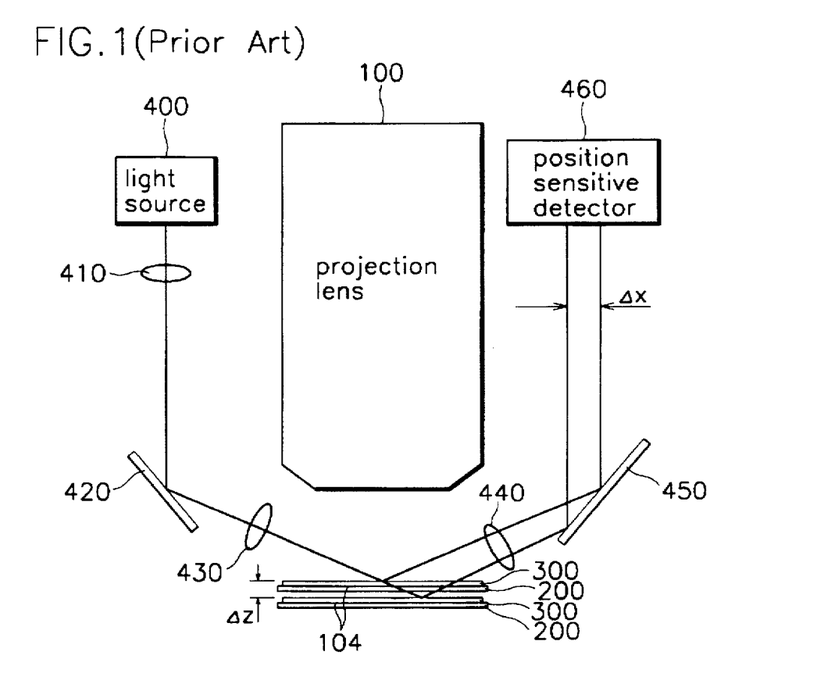
FIG. 1 is a diagram illustrating a conventional system to detect the position of a substrate in the light-exposure equipment used in the production process of a semiconductor devices.

FIG. 1 is a diagram illustrating a conventional system for detecting the position of a substrate to place a semiconductor substrate in the focus-position of a projection lens.

This system has a structure arranged right and left centered around a projection lens 100, which is part of an exposure equipment, and a substrate support 200 under it. Here, a substrate 300, as the object of exposure, is placed on the substrate support 200. On one side of the projection lens 100 is placed a light source 400 to emit light, a first lens 410 to make the light parallel from the light source 400, a first mirror 420 to reflect parallel light sent through the first lens 410, and a second lens 430 to condense the light which is reflected from the first mirror 420 onto the substrate 300.

On the other side of the projection lens 100 is placed a third lens 440 to condense the light reflected by a substrate 300, a second mirror 450 to reflect the light condensed by the third lens 440, and a position sensitive detector 460 to detect the position of a substrate by using the light reflected by the second mirror 450.

This system for detecting the position of a substrate operates as follows:

If the source of electric power is operated by a user, light is emitted from the light source 400. The light emitted from the light source 400 is transformed into parallel light when passing through the first lens 410. The light is reflected by the first mirror 420, passes through the second lens 430 and is condensed on the surface of the substrate 300.

The condensed light is reflected from the surface of the substrate 300, condensed through the third lens 440, reflected from the second mirror 450, and finally reaches a position sensitive detector 460.

If a substrate 300 moves toward the optical axis, a light-point reaching the position sensitive detector 460 is also changed. The relation of the position change delta-z of the substrate 300, and the position change delta-x of the light-point appearing in a position sensitive detector 460 can be computed from the incidence angle of the light which is projected on the substrate 300. Therefore, after determining the position change of a substrate 300 through the position change of the light spot impinging of the position sensitive detector 460, a user can choose the substrate 300 position by driving the substrate support 200.

Figure 2:
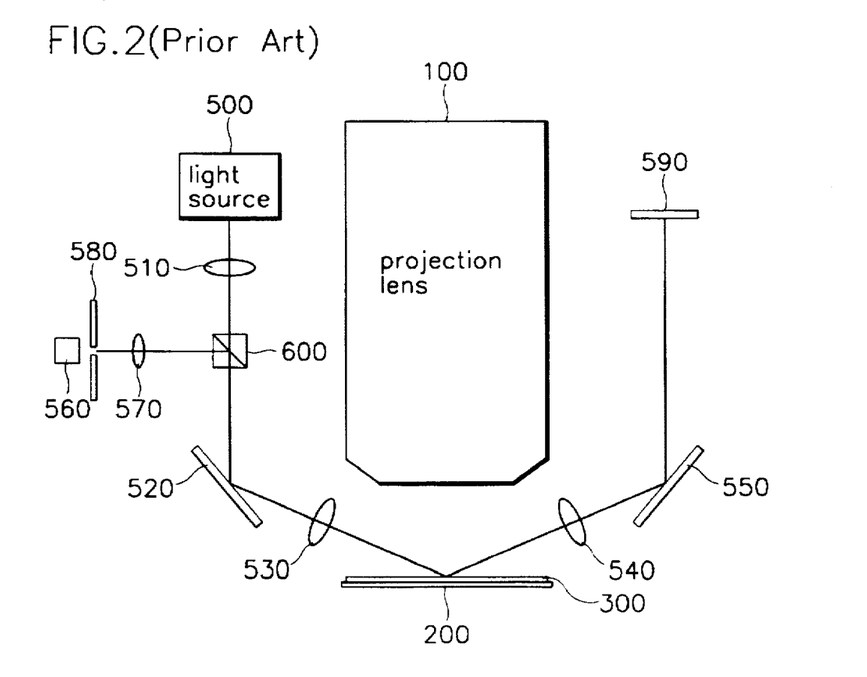
FIG. 2 is a diagram illustrating another conventional system to detect the position of a substrate in a light-exposure equipment used in the production process of a semiconductor device.

FIG. 2 is a diagram illustrating another conventional system for detecting the position of a substrate used in light-exposure equipment for production of a semiconductor substrate.

One side of the projection lens 100 of light-exposure equipment includes a light source 500 emitting light. A first lens 510 makes the light emitted from the light source 500 parallel. A beam splitter 600 transmits the light as it passes through the first lens 510, and reflects light from the first mirror 520. A fourth lens 570 condenses light reflected by the beam splitter 600. A board 580 has a pin hole through which the light condensed by the fourth lens 570 passes. A photoreceiver 560 detects the light which passes through the pin hole of the board 580. The first mirror 520 reflects the light which passes through the beam splitter 600, and a fourth lens 570 condenses the light reflected by the above first mirror 520.

The other side of the projection lens 100 includes a third lens 540 to condense the light reflected by the substrate. A second mirror 550 reflects light condensed by the third lens 540, and a third mirror 590 reflects the light which is reflected by the second mirror 550 toward the second mirror again.

The operation of a detecting system of the position of a substrate of this type is as follows:

If the source of electric power is operated by a user, light is emitted from the light source. The light emitted from the light source is formed into parallel light while passing through a first lens 510. This light is reflected from the first mirror 520 after passing through a beam splitter 600 and is condensed on the surface of a substrate 300 which is placed on a substrate support 200 after passing through a second lens 530. The condensed light is reflected from the surface of the substrate 300, condensed through a third lens 540, reflected from a second mirror 550, and reaches a third mirror 590. The light which reaches the third mirror 590 is reflected, proceeds to the second mirror 550 where it is reflected again, and finally, condensed on the surface of the substrate 300 by the third lens 540. The reflected light which is condensed on the surface of the substrate 300 proceeds to the second lens 530 by reflection from the substrate 300. The second lens 530 transmits the reflected light to the first mirror 520 after forming it into parallel light. This light proceeds to the beam splitter 600 after being reflected from the first mirror 520, and to the fourth lens 570 after being reflected by the beam splitter 600. The fourth lens 570 condenses the light and then transmits it to a board 580 having a pin hole. The light which has passed through this pin hole reaches a photoreceiver 560.

At this time, if the substrate 300 moves in the optical axis of the projection lens 100, that is, in the direction of delta-z from FIG. 1, the position of a light spot which reaches the photoreceiver 560 is also changed. The relation between the position change of the substrate 300 and that of a light-point appearing on the photoreceiver 560 can be computed from the incidence angle of the light which is projected on the substrate 300 as in FIG. 1. Therefore, after determining the position change of the substrate 300 through the position change of the light spot which is shown in the position sensitive detector 560, a user can move the substrate 300 to a desired position by adjusting the substrate support 200.

However, as seen in the above, these systems have several defects in that they can detect only the position of a substrate relative to the optical axis of the projection lens, and require a great deal of expense and time because they have to employ another device in order to detect the slope of the substrate.

SUMMARY OF THE INVENTION

Accordingly, an object of the present invention is to move a target to a correct position by detecting the position and slope of the target by using one device, something not achieved by conventional devices.

To achieve the above purpose, according to the present invention, a control system, as embodied and broadly described herein, comprises a light source that emits light of a fixed type a light source that emits light to be transmitted to and reflected from the target; a first mask through which the light emitted from the light source passes, and on which an asymmetric pattern is recorded; first and second photoreceivers for detecting the light reflected from the target; and control means for adjusting the position and slope of the target based on signals received from the photoreceivers.

According to another aspect of the present invention, a control system comprises a light source that emits light to be transmitted to and reflected from the target; a mask through which the light emitted from the light source passes before being reflected from the target, and on which an asymmetric pattern is recorded; a mirror for reflecting the emitted light, which has been reflected from the target, back to the target; first and second photoreceivers for detecting the light from a beam splitter, that is a light distributor, the beam splitter positioned in the path of the light after the light is reflected from the mirror and then the target.

It is to be understood that both the foregoing general description and the following detailed description are exemplary and explanatory and are intended to provide further explanation of the invention as claimed.

The accompanying drawings are included to provide a further understanding of the invention and are incorporated in and constitute a part of this specification, illustrate several embodiments of the invention and together with the description serve to explain the principles of the invention.

DESCRIPTION OF THE PREFERRED EMBODIMENT

The general principle of the present invention will now be explained.

Light emitted from the light source is projected on a target through an optical section which is composed of a lens, a mirror, etc., reflected from the target, and projected on a photoreceiver. At this time, the position change of the target is shown by the change of the light-path projected on the photoreceiver. However, for perceiving changes of light-paths, a mask is placed between a light source and a target, patterns which are carved on this mask form images on the surface of a target through a lens, are reflected again, and are projected onto a photoreceiver. At this time, each light-path which is divided into two by a beam splitter is projected on different photoreceivers, respectively, and patterns which are carved on the mask form images on the surface of a photoreceiver. The position change of the target appears as that of the pattern recorded on the mask, and the photoreceiver perceives the change of the position and slope of the target by perceiving this position change, and adjusts the position of the target.

Figure 4:
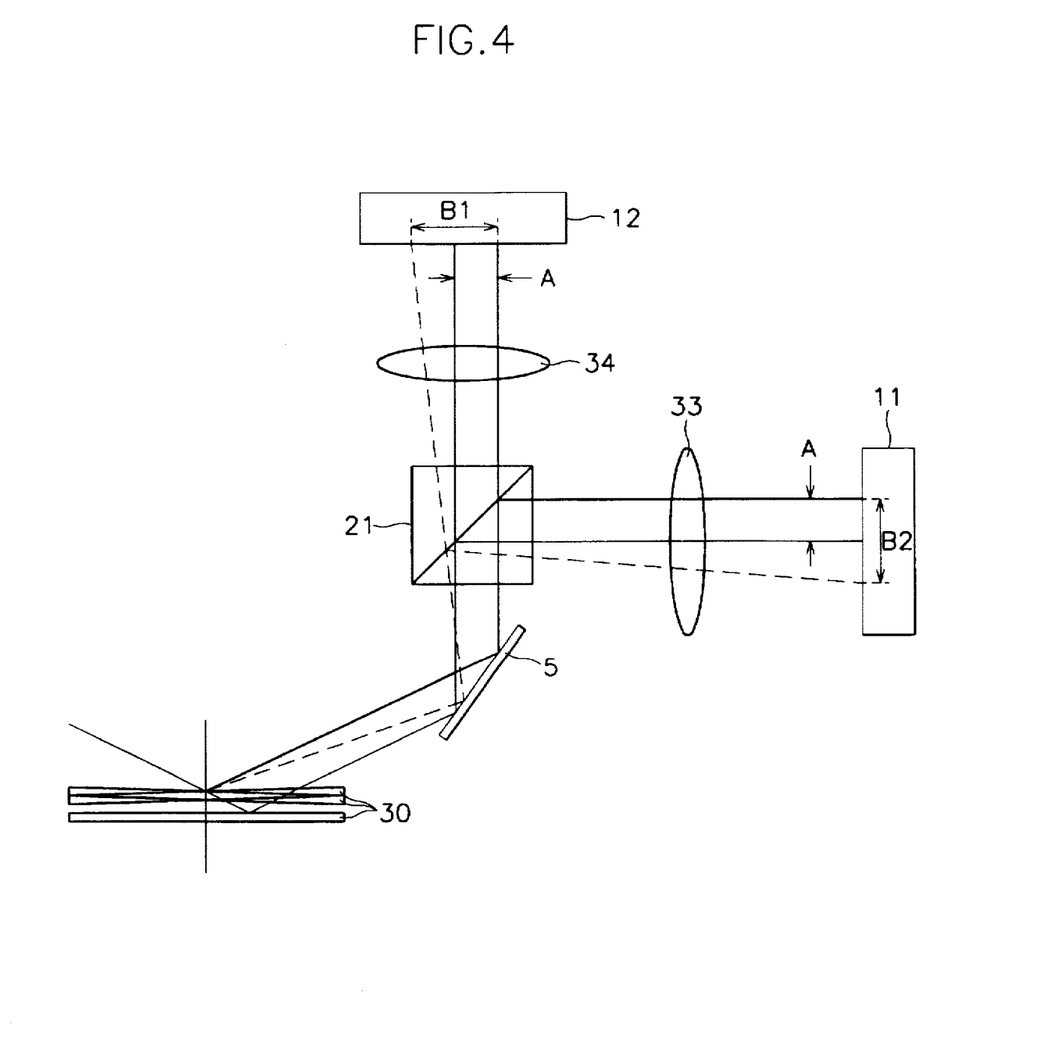

By using two photoreceivers (11, 12) in the above device, it is possible to perceive the slope of a target and the position change toward the optical axis of a projection lens 100 at the same time, as shown in FIG. 4.

A thick solid line represents the direction of light reflected from a target and a mirror 5 when the target is located at a position without any change of the position or slope. A thin solid line represents the direction of light reflected from a target and a mirror 5 when a target changes only its position toward the optical axis of a projection lens 100 without any change in the slope. A dotted line represents the direction of the light reflected from the target and the mirror 5 when the position of a target is only leaned, that is, the slope is changed, without any position change toward the optical axis of a projection lens 100.

If a target changes only its position, the light reflected from the target proceeds parallel with the light (the thick solid line), and finally, the position change of the light (the thin solid line) projected on two photoreceivers (11, 12) has the same value, A. However, if the slope of the target is changed without a change of position of the target, the light reflected from the target does not proceed in parallel, but leaned (indicating target slope). Therefore, if the focal lengths of lenses (33, 34) are different from each other, each position change of the light projected on the two photoreceivers (11, 12) also have two different values of B1, B2, respectively. Therefore, the leaning and position change of a target can be perceived distinctly from each other by perceiving whether each position change of light projected on the two photoreceivers is separated by the same length or a different length from the standard light (the thick solid line).

This device can also detect the leaning and position change of a target by using the above light, which is reflected the light, which is reflected by the target, proceeds to the target again and is again reflected on the target. Further, this device can include a means to transmit the light reflected by the target to the beam splitter.

The light emitting means includes a light source to emit light and a first mask on which a fixed pattern for light passage is carved. For a pattern carved on the first mask, an asymmetric pattern is appropriate to determine the position and slope of a target. The light emitting means can further include a parallel means to make the light emitted from the light source parallel and to transmit it to the above first mask. The light emitting means can also include a first condensing means to condense the light, which is passed through the mask.

The first condensing means can include a condensing lens to condense the light which is passed through the first mask as well as a mirror to reflect the light which is condensed by the lens to the target. Also, this device can further include a second condensing means to condense light divided by the beam splitter on the first photoreceiver as well as a third condensing means to condense the light divided by the beam splitter on the second photoreceiver.

The first and second photoreceivers may be charge coupled devices (CCDs), or a combination of a mask, having the same structure as the above mask, and a photodiode, through which the light divided by the beam splitter passes. The mask-photodiode combination may further include a condensing means to condense the light, which passes through each mask to construct the above first and second photoreceivers, on the photoreceivers, or a lens to transmit an image to each mask which constitutes the first and second photoreceivers, after forming the image by using the light divided from the beam splitter associated with first and second photoreceivers.

This device may also include a third photoreceiver to correct changes in intensity of light from the emitting means. In such a case, this device also include another beam splitter to transmit one of the light paths to the first mask and to transmit another one of light-paths to the third photoreceiver, after dividing light-path derived from the emitting means.

This device can additionally include a control part to detect the position and slope of a target by reading signals shown in the first and second photoreceivers, and a driving part to move the target under commands given from the control part, in order to position the target after detecting the position and slope of a target.

Reference will now be made in detail to a preferred embodiment of the invention, an example of which is illustrated in the accompanying drawings. Wherever possible, the same reference characters will be used throughout the drawings to refer to the same or like parts.

Figure 3:
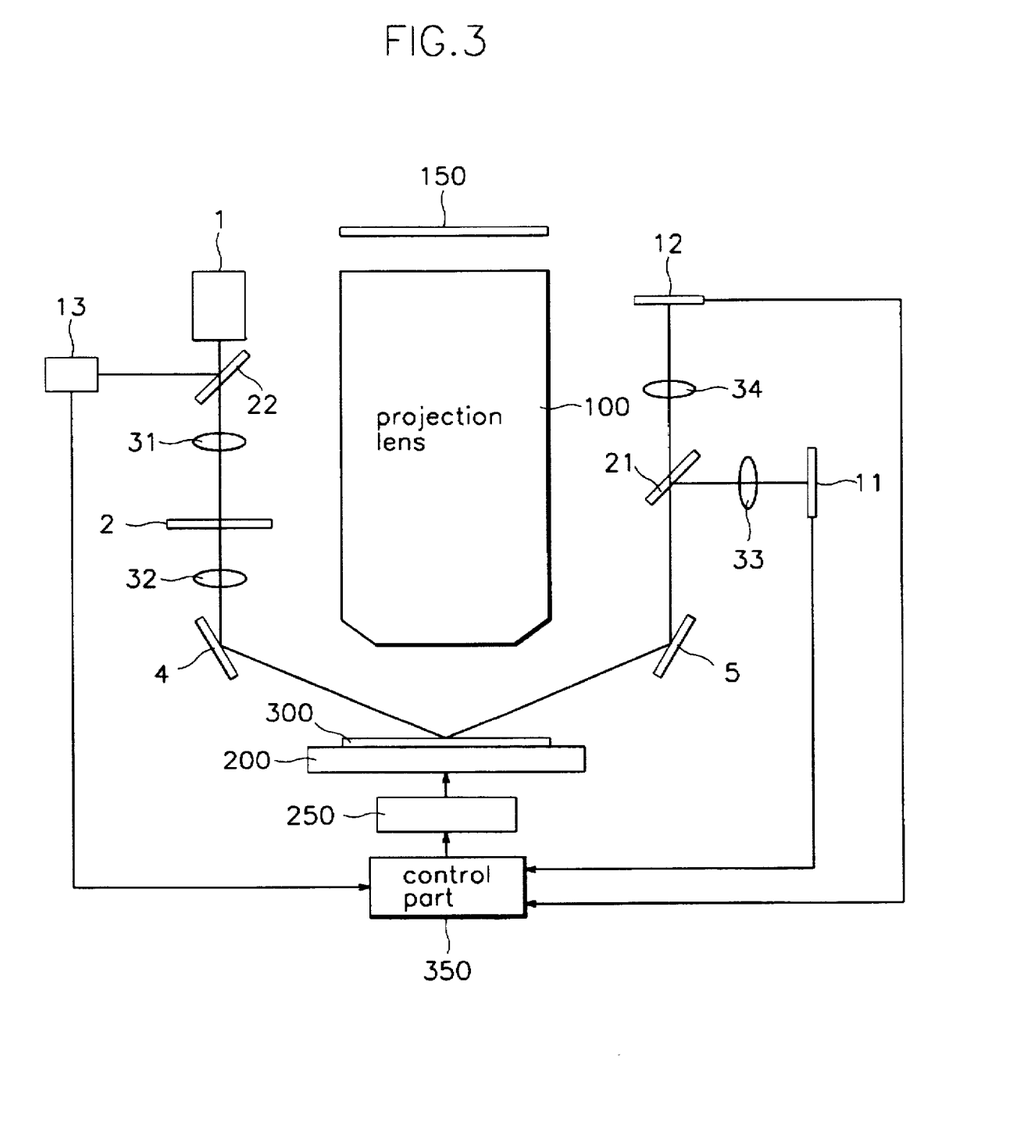
FIG. 3 and 4 are diagrams illustrating a control device of the position and slope of a target according to a first preferred embodiment of the present invention.

FIG. 3 and 4 are diagrams illustrating a control system for controlling the position of a target according to a first preferred embodiment of the present invention. At the center, a projection lens 100 which is a part of the light-exposure equipment is placed. Under the projection lens 100, a support 200 is positioned to place the target 300 on. The target may be a semiconductor wafer or substrate on which an image of a projected microscopic circuit may be formed. The support 200 is connected to a driving device 250 adjusted by a control part 350.

On one side of the projection lens 100, a light emitting means is placed which emits light of a fixed type and transmits it to a target. This light emitting means is composed of several component parts as follows.

Figure 6:
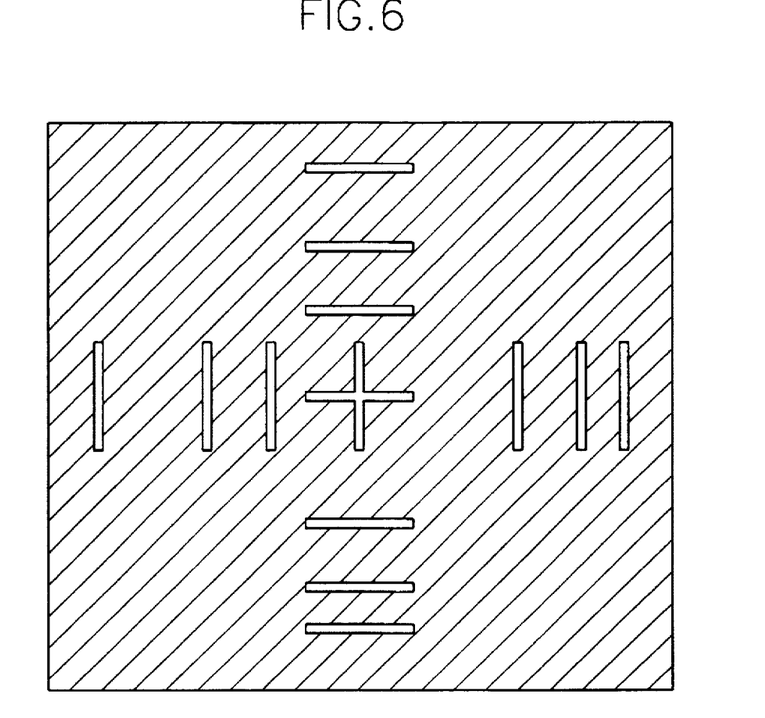
FIG. 6 is a diagram illustrating a pattern of a first mask used in a preferred embodiment of the present invention.

First of all, to emit light of a fixed type, a first mask 2 with a carved pattern is needed through which the light-source 1 emits light. The light source may be, for example, a light emitting diode, a mercury-arc lamp, a halogen lamp, or a laser. The above first mask 2, owing to an asymmetric pattern carved as illustrated in FIG. 6, can distinguish the position change of an image detected on a photoreceiver. In FIG. 6, the part marked with slanted lines is an opaque part through which light cannot pass. The remaining part of the mask is a part through which light can pass.

A first lens 31 transforms the light from the light source 1 into parallel light. Under the first mask 2, a second lens 32 forms an image by using the light which is passed through a first mask 2. And, a first mirror 4 transmits the light which is passed through the second lens 32 to the target.

Furthermore, additional means to adjust fluctuation in the intensity of the light emitted from the above light source may be installed. For example, a beam splitter 22 divides the light, which is emitted from the light source 1, into two paths, and a third photoreceiver 13 detects the light divided by the beam splitter 22. A semitransparent mirror or the like can be used for a beam splitter 22.

On the other side of the projection lens 100 is positioned a means to detect light which is divided into two paths after it is reflected by the target 300. It is composed of a beam splitter 21 to divide the light reflected by the target 300 into two light paths; a first photoreceiver 11 to output a signal corresponding to the light which is divided by the above beam splitter 21; and a second photoreceiver 12 to output a signal corresponding to the other light path which is divided by the beam splitter 21 but not input to the first photoreceiver 11. Also, in front of the first and second photoreceivers (11, 12) are placed two lenses (33, 34) forming light which is divided by the above beam splitter 21 after reflecting on the pattern by the target. And, a mirror 5 to transmit the light reflected by the target 300 to the beam splitter 21 is placed.

For the first and second photoreceivers (11, 12), a charge coupled device (CCD) or a combination of a mask, on which the same pattern as the first mask 2 is formed, and a photodiode are used. The mask-photodiode combination may include additionally a lens to form an image by using the light from the above light distributor, and a lens to condense the light which passes through the mask.

Finally, a control part 350 corrects changes in intensity of signals detected by the first and second photoreceivers (11, 12), which occur due to fluctuation in intensity of the light, by reading signals detected by the third photoreceiver 13. The control part determines the position and slope of the target 300 by reading signals detected by the first and second photoreceivers (11, 12), and adjusts the position and slope of the target 300 by moving the substrate support 200 on which the target 300 is placed by using the driving device 250, comprising a motor, etc.

If the source of electric power is operated by a user, a light-source 1 emits light. Part of the light emitted from the light-source is projected on the third photoreceiver 13 after dividing at the beam splitter 22. The third photoreceiver 13 outputs signals corresponding to perceived fluctuations in intensity of the light emitted from the light source 1. A control part 350 adjusts gain to adapt intensity of signals appearing on the first and second photoreceivers to a proper value.

The other part of the light divided at a light-source 1 passes through the beam splitter 22 and is transformed into parallel light by a first lens 31. The light, which passes through the first mask 2 is formed into the image of the pattern carved on the mask 2 and then proceeds to the first mirror 4 and is reflected. The image reflected from the target 300 is reflected at the mirror 5 and then reaches the beam splitter 21. Some of the light divided by the beam splitter 21 forms an image on the first photoreceiver 11 through the lens 33. The light on the other path not proceeding to the first photoreceiver 11 forms an image on a second photoreceiver 12 through the lens 34.

The standard image embedded in the above first and second photoreceivers (11, 12) is identical to the pattern of the first mask 2. After comparing a standard image with images which are formed on themselves, the two photoreceivers (11, 12) output signals corresponding to the comparison. Alternatively, the standard images received by the photoreceivers (11, 12) may be stored in control part 350. During operation, images received by the photoreceivers (11, 12) are output to the control part 350 for comparison to their respective standard image. A control part 350 adjusts the position and slope of a target by commanding the driving device 250 after analyzing these signals.

Figure 7:
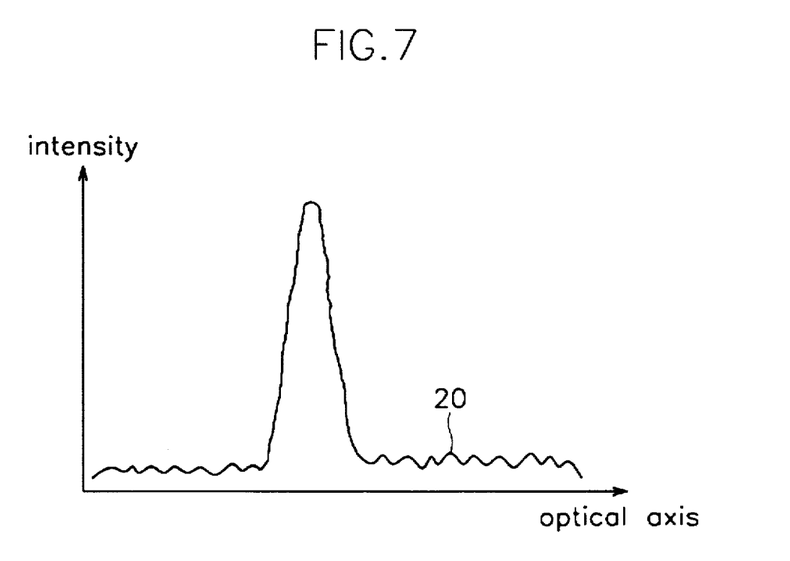
FIG. 7 is a diagram of functions which are formed by intensity distribution of arranged signals in a control device of the position and slope of a target according to a preferred embodiment of the present invention.
Figure 8:
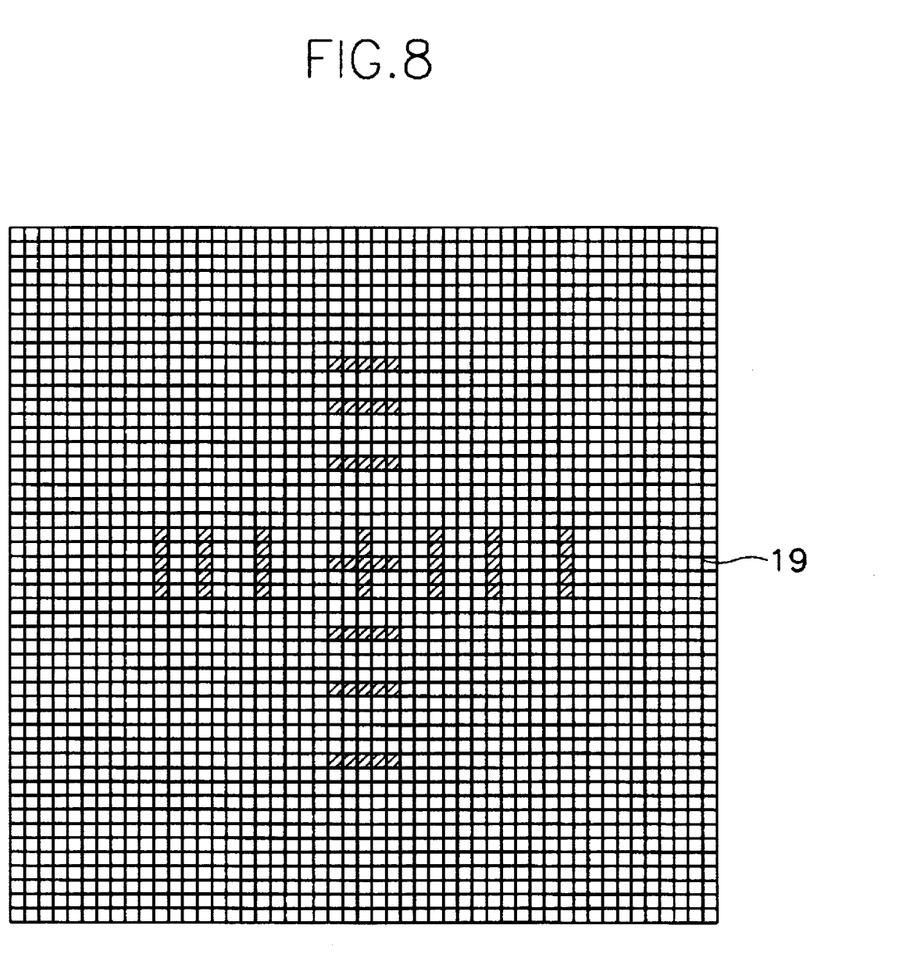
FIG. 8 is a diagram illustrating a pixel structure of a first and a second charge coupled devices (CCDs) for a control device of the position and slope of a target in a light-exposure equipment according to a preferred embodiment of the present invention.

FIG. 7 is a graph illustrating a type of arrangement signal which passes through an arithmetic process after being outputted from the first and a second photoreceivers (11, 12). Its x-axis indicates a distance measured along the optical axis of a projection lens, while its y-axis indicates intensity of light. They can be obtained from the function of intensity distribution of arranged light as well as designated pixel. If a target is out of the fixed focus of a projection lens 100 or is sloped toward the optical axis, the value of the arrangement signal determined from a correlated function has a smaller value than the maximum value, whereas if a target is exactly on the fixed focus of a projection lens 100 or is not sloped, it has the maximum value.

The control part 350 changes the position and slope of the support 200 by using a driving device 250 to drive the support 200 on which the target 300 is placed, and adjusts the value of the arrangement signal to the maximum value.

Figure 5:
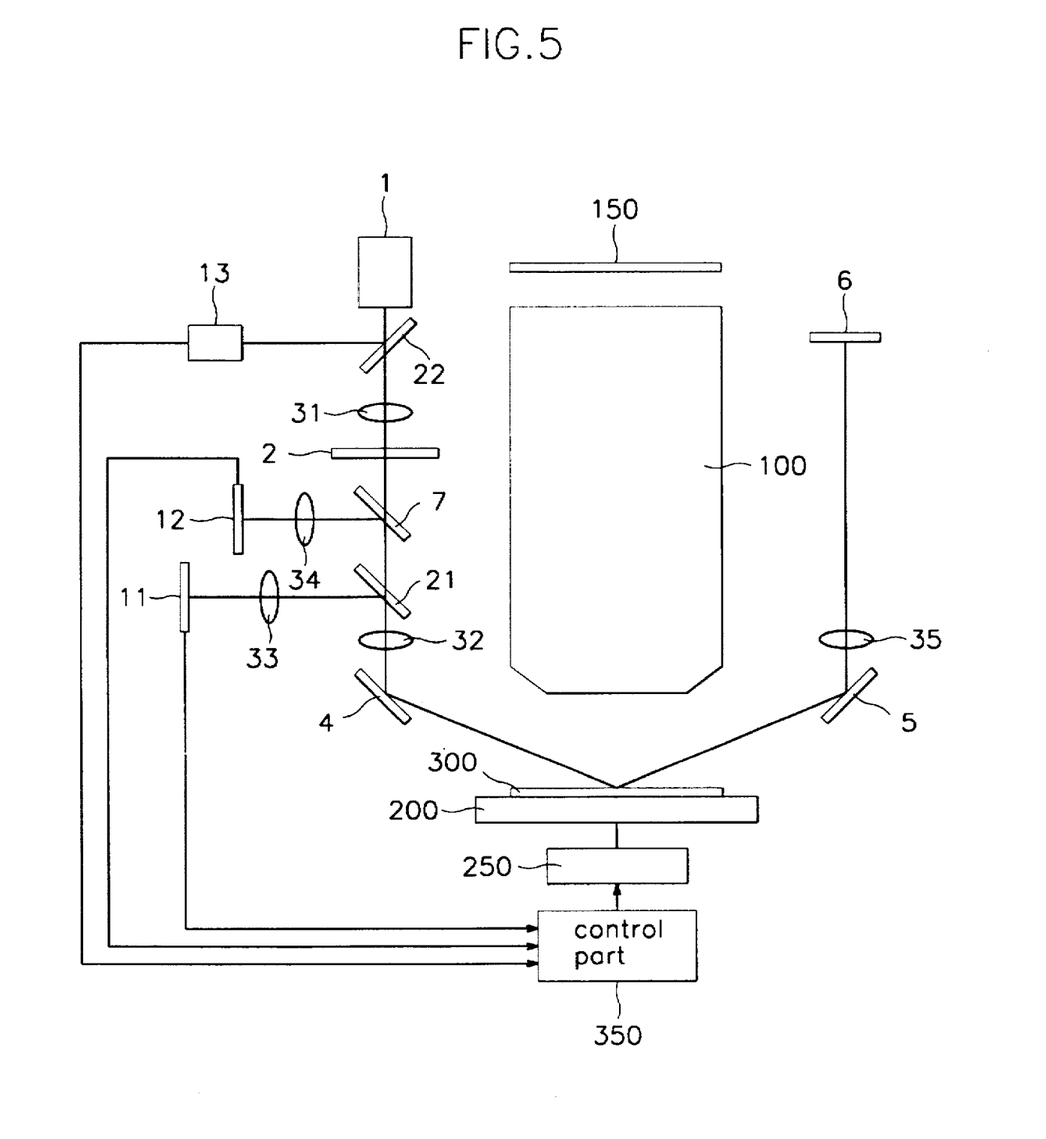
FIG. 5 is a diagram illustrating a control device of the position and slope of a target in a light-exposure equipment according to a second preferred embodiment of the present invention.

FIG. 5 is a diagram illustrating a control device for the position and slope of the target according to a second preferred embodiment of the present invention.

As illustrated in FIG. 5, a control device of the position and slope of a target according to a second preferred embodiment of the present invention has two photoreceivers (11, 12) which are placed at the same side of the light-source 1, unlike the first preferred embodiment. This embodiment is explained in detail below.

On one side of a projection lens 100, a light emitting means emits light of a fixed type and transmits it to where a target 300 is placed. A means to detect each light, after dividing the path of the light reflected twice by the target 300 into two paths, is also placed.

A light emitting means is composed of several component parts as follows:

Firstly, to emit light of a fixed type, a first mask 2 on which a light-source 1 to emit light and carve a pattern is needed. The above first mask 2, owing to an asymmetric pattern carved thereon, for example, as illustrated in FIG. 6, can distinguish the position change of an image detected on a photoreceiver. In FIG. 6, the portion marked with slanted lines is the opaque portion through which light cannot pass. The other remaining portion is a part through which light can pass.

A first lens 31 is placed to transform the light, from the light source 1 into parallel light. Under the first mask 2 a second lens 32 to form an image by using the light which is passed through a first mask 2 is placed. And, a first mirror 4 is placed to transmit the light which is passed through the second lens 32 to the target.

Furthermore, means to correct fluctuation in intensity of signals on first and a second photoreceivers due to the fluctuation in intensity of light emitted from the light-source, a beam splitter 22 to divide the path of the light into two paths, and a third photoreceiver 13 to detect the light divided at the beam splitter 22 are used. A semitransparent mirror, etc. can be used for a beam splitter 22.

Also, a means is placed to detect each light path after dividing the path of the light reflected by the target 300 into two paths. A beam splitter 21 divides the light reflected by the target 300 into two or more beams. A first photoreceiver 11 outputs a signal corresponding to the light which is divided by the beam splitter 21. A second photoreceiver 12 outputs a signal corresponding to the other light path which is divided by the above beam splitter 21 but not directed to the first photoreceiver 11. The light from the light source 1 should be projected as it is, because the beam splitter 21 may be placed on the path to which lights proceed. Also, a third beam splitter 7 to transmit the light from the beam splitter 21 into a second photoreceiver 12 may be included. The light from the above light source 1 should be projected as is, because this third beam splitter 7 may be placed on the path to which lights proceed.

Lenses (33, 34) form an image using the light divided by the beam splitter 21 after being reflected by a target 300 and are placed in front of the first and second photoreceivers (11, 12), respectively. The second lens 32 transmits the light to the beam splitter 21 after condensing the light reflected twice by the target 300.

Charge coupled device (CCD) or a combination of a mask, on which the same pattern with the first mask is carved, and a photodiode are used for the first and a second photoreceivers (11, 12). The mask-photodiode combination may include additionally a lens to form an image by using the light from the above light distributor, and a lens to condense the light which passes through the mask.

On the other side of the projection lens 100, a reflection means 600 for reflecting the light, which is reflected by the target 300 after being emitted from the light emitting means, to the target 300 again is placed.

The above reflection means 600 includes a lens 35 to condense the light from the target 300, and a corner cube or a mirror to reflect the light which pass through the lens 35, to the target 300, again. In FIG. 5, the corner cube 6 is shown. Also, the reflection means 600 may further include a mirror 5 to reflect the light emitted from the above target 300.

Finally, a control part 350 adjusts the gains to adapt the intensity of signals appearing on the first and a second photoreceivers (11, 12) to a proper value by reading signals from the third photoreceiver 13, determining the position and slope of the target 300 by reading signals from the first and second photoreceivers (11, 12), and adjusts the position and slope of the target 300 by moving the substrate support 200 on which the target 300 is placed by using a driving device 250 such as a motor, etc.

If the source of electric power is operated by a user, a light source 1 emits light. Part of the light emitted from the light source is projected on the third photoreceiver 13 after being divided by the beam splitter 22. The third photoreceiver 13 outputs signals corresponding to perceived fluctuations in intensity of light emitted from the light source 1. A control part adjusts gain to adapt intensity of signals appearing on the first and second photoreceivers to a proper value.

The other part of the light divided at a light-source 1 passes through the beam splitter 22 and is transformed into parallel light by a first lens 31. The light, which passes through the first mask 2 is formed into an image of the pattern which is carved on said mask 2 and then proceeds to the first mirror 4 after being condensed by a second lens 32, forms an image on the surface of the target 300 which is placed on the support 200 after being reflected by the first mirror 4, and, at the same time, is reflected. The image reflected from a target 300 is reflected at the mirror 5 and then reaches the beam splitter 21. Some of the light divided by the beam splitter (21) forms an image on the first photoreceiver 11 through the lens 33. The light on the other path not proceeding to the first photoreceiver 11 forms an image on a second photoreceiver 12 through the lens 34.

The standard images embedded in the above first and second photoreceivers (11, 12) are identical to the patterns of the first mask 2. After comparing a standard image with images which are formed on themselves, the two photoreceivers (11, 12) output signals corresponding to the comparison. Alternatively, the standard images received by the photoreceivers (11, 12) may be stored in control part 350. During operation, images received by the photoreceivers (11, 12) are output to the control part 350 for comparison to their respective standard image. A control part 350 adjusts the position and slope of a target by commanding the driving device 250 after analyzing these signals.

The control part 350 changes the position and slope of the support 200 by using a driving device 250 to drive the support 200 on which the target 300 is placed, and adjusts the value of the arrangement signal to be the maximum value.

In the above preferred embodiment, the image is reflected twice to raise signal-resolutions which are detected on photoreceivers.

As described above, the present invention which uses two or more photoreceivers adjusts the position and slope of targets as changes are detected, and compensates for perceived light path change by using a charge coupled device (CCD) or a combination of a photodiode, a lens and a mask.

The apparatus and methods described above comprise preferred embodiments of the present invention. However, it will be apparent to those skilled in the art that various modifications and variations can be made in the apparatus and methods of this invention without departing from the spirit or scope of the present invention. The present invention covers such modifications and variations which are within the scope of the appended claims and their equivalents.

What is claimed is:

1. A control system for controlling the position and slope of a target, comprising:

a single light source that emits light to be transmitted to and reflected from the target;

a first mask through which the light emitted from the single light source passes, said first mask having a non-periodic pattern recorded thereon;

first and second charge coupled devices for detecting the light from the single light source after reflection from the target;

control means for adjusting the position and slope of the target based on signals received from the first and second charge coupled devices; and a first beam splitter positioned between the target and the charge coupled devices for dividing the emitted light into a first light path and a second light path, wherein the first light path is directed through a first lens to the first charge coupled device, and the second light path is directed through a second lens to the second charge coupled device.

2. The control system of claim 1, further comprising a second beam splitter placed between the light source and the first mask, a third charge coupled device coupled to said second beam splitter for measuring changes in intensity of light reflected from said second beam splitter and a device for adjusting the gain of signals taken from said first and second charge coupled devices based on the output from said third charge coupled device.

3. The control system of claim 1, further comprising a lens placed between the first mask and the target, wherein the lens forms an image on the target by using the pattern of the mask.

4. The control system of claim 1, wherein the target comprises a coating sensitive to selected radiation wavelengths and the light source emits light at a wavelength other than the selected wavelengths.

5. The control system of claim 1, wherein the light source comprises a laser.

6. The control system of claim 1, wherein the light source comprises a light emitting diode.

7. The control system of claim 1, wherein the light source comprises a mercury-arc lamp.

8. The control system of claim 1, wherein the light source comprises a halogen lamp.

9. The control system of claim 1, further comprising a second mask in front of each charge coupled device.

10. The control system of claim 1, wherein said control means includes:

means for initially storing a standard image corresponding to said asymmetric pattern on the first mask on the photoreceivers when the target is correctly positioned; and means for comparing mask images received by the first and second photoreceivers to the standard images.

11. A control system for controlling the position and slope of a target, comprising:

a single light source that emits light to be transmitted to and reflected from the target;

a first mask through which the light emitted from the single light source passes before being reflected from the target, said first mask having a non-periodic pattern recorded thereon;

a mirror for reflecting the emitted light, which has been reflected from said target, back to said target;

a first beam splitter positioned in the path of the light after the light is reflected from said mirror and then said target; and first and second charge coupled devices for detecting the light reflected from the first beam splitter;

wherein the first beam splitter is positioned between the target and the charge coupled devices for dividing the emitted light into a first light path and a second light path, wherein the first light path is directed through a first lens to the first charge coupled device, and the second light path is directed through a second lens to the second charge coupled device.

12. The control system of claim 11, wherein said mirror comprises a corner cube.

13. The control system of claim 11, further comprising a second beam splitter placed between the light source and the first mask, a third charge coupled device coupled to said second beam splitter for measuring changes in intensity of light reflected from said second beam splitter, and a device for adjusting the gain of signals taken from said first and second charge coupled devices based on the output from said third charge coupled device.

14. The control system of claim 11, further comprising a lens placed between the first mask and the target for forming an image on the target by using the asymmetric pattern of the mask.

15. The control system of claim 11, wherein the target comprises a coating sensitive to selected radiation wavelengths and the light source emits light at a wavelength other than the selected wavelengths.

16. The control system of claim 11, wherein the light source comprises a laser.

17. The control system of claim 11, wherein the light source comprises a light emitting diode.

18. The control system of claim 11, wherein the light source comprises a mercury-arc lamp.

19. The control system of claim 11, wherein the light source comprises a halogen lamp.

20. The control system of claim 11, further comprising a second mask in front of each charge coupled device.

21. A control system for controlling the position and slope of a target, comprising:

a single light source that emits light to be transmitted to and reflected from the target;

a first mask through which the light emitted from the single light source passes, said first mask having a non-periodic pattern recorded thereon;

first and second photodiodes for detecting the light from the single light source after reflection reflected from the target;

a second mask having the non-periodic pattern of the first mask and positioned in front of the first and second photodiodes;

control means for adjusting the position and slope of the target based on signals received from the first and second photodiodes; and a first beam splitter positioned between the target and the photoreceivers for dividing the emitted light into a first light path, wherein the first light path is directed through a first lens to the first photodiode, and the second light path is directed through a second lens to the second photodiode.

22. A control system for controlling the position and slope of a target, comprising:

a single light source that emits light to be transmitted to and reflected from the target;

a first mask through which the light emitted from the single light source passes before being reflected from the target, said first mask having a non-periodic pattern recorded thereon;

a mirror for reflecting the emitted light, which has been reflected from said target, back to said target;

a first beam splitter positioned in the path of the light after the light is reflected from said mirror and then said target;

first and second photodiodes for detecting the light reflected from the first beam splitter; and a second mask having the non-periodic pattern of the first mask and positioned in front of the first and second photodiodes;

wherein the first beam splitter is positioned between the target and the photodiodes for dividing the emitted light into a first light path and a second light path, wherein the first light path is directed through a first lens to the first photodiode, and the second light path is directed through a second lens to the second photodiode.

* * * * *

UNITED STATES PATENT AND TRADEMARK OFFICE
CERTIFICATE OF CORRECTION

PATENT NO. : 5,742,397
DATED : April 21, 1998
INVENTOR(S) : Sang-Cheol KIM

It is certified that error appears in the above-identified patent and that said Letters Patent is hereby corrected as shown below:

Claim 21, column 12, line 12, after "light path" (first occurence), insert --and a second light path--.

Signed and Sealed this

Eleventh Day of May, 1999

*Attest:*

Q. TODD DICKINSON

*Attesting Officer*      *Acting Commissioner of Patents and Trademarks*